(12) United States Patent
Meier et al.

(10) Patent No.: US 6,430,078 B1
(45) Date of Patent: Aug. 6, 2002

(54) LOW-VOLTAGE DIGITAL ROM CIRCUIT AND METHOD

(75) Inventors: Victoria Meier, Ft. Collins; Robert J. Martin, Timnath, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/898,796

(22) Filed: Jul. 3, 2001

(51) Int. Cl.[7] ............................................... G11C 17/00
(52) U.S. Cl. ..................... 365/104; 365/94; 365/202; 365/189.09
(58) Field of Search .................. 365/94, 104, 189.01, 365/189.09, 202, 230.01

(56) References Cited

U.S. PATENT DOCUMENTS 4,845,679 A * 7/1989 Vu .............................. 326/118
5,459,693 A * 10/1995 Komarek et al. ......... 365/189.07

* cited by examiner

Primary Examiner—David Nelms
Assistant Examiner—Thong Le
(74) Attorney, Agent, or Firm—Kyle J. Way

(57) ABSTRACT

A circuit and method of implementing a digital read-only memory (ROM) utilizes a means for selectively driving one of two complementary logic state signal lines to a voltage reference upon a readout signal for an addressable bit becoming active. Each complementary logic state signal line represents one of two logic states. The logic state of the addressed bit is determined by which of the two complementary logic state signal lines is driven. The logic level of each complementary logic state signal line is then inverted and driven onto the other so that both signal lines will be driven to their proper logic state, thereby allowing either signal line to be used in ascertaining the logic state of the bit being addressed.

26 Claims, 7 Drawing Sheets

LOW-VOLTAGE DIGITAL ROM CIRCUIT AND METHOD

BACKGROUND OF THE INVENTION

In order to increase the functional capacity of digital integrated circuits (ICs), IC designers necessarily implement progressively smaller geometries for metal-oxide-semiconductor field effect transistors (MOSFETs, or FETs) and other IC devices so that more circuitry per unit area may reside on an IC die. However, generally accompanying the smaller geometries and higher circuit densities are lower transistor breakdown voltages and higher power consumption, thus requiring the use of lower power supply voltages. Unfortunately, the use of a lower power supply voltage typically reduces the available amount of voltage margin, which allows an IC to operate properly in the presence of unavoidable variations in manufacturing processes, supply voltage, and operating temperature. As a result, circuit designs utilized in larger geometry ICs may become less fault tolerant when the same design is translated into an IC utilizing a smaller geometry.

An example of such a design is an IC read-only memory (ROM) circuit. A ROM is commonly employed to great advantage as a functional portion of a larger IC design, such as a control information store, or as a standalone IC. A typical IC ROM circuit arrangement from the prior art is shown in FIG. 1. In this case, an n-word by m-bit ROM comprises individual ROM bits 110 for each data bit to be stored. Each word of the ROM is enabled for reading by one of n separate READOUT signal lines, which are normally generated by an address decoder (not shown). At most one READOUT signal line is active at any particular time. The outputs of each ROM bit 110 associated with the same data bit of each word are connected to form an OUT signal line. Each OUT signal line is then an input for a signal buffer 120 associated with that bit of the data word to be read. Thus, the outputs of all signal buffers 120 collectively represent DATA, the m-bit data word currently being read.

FIG. 2 shows ROM bit 110 and signal buffer 120 in greater detail. ROM bit 110 is implemented by a single n-channel FET (NFET) $N_R$, the gate of which is driven by one of the READOUT signals, $READOUT_x$. The source of NFET $N_R$ is connected to either a ground reference via a ground connection 230, or to a power supply voltage reference $V_{DD}$ via power supply connection 240, depending on which of the two logic states, LOW or HIGH, is to be represented by ROM bit 110. When $READOUT_x$ is HIGH, $N_R$ turns ON, allowing the voltage at the source of $N_R$ to pass to OUT signal line $OUT_y$, less the turn-on voltage across $N_R$. The voltage on $OUT_y$ is then passed to the input of signal buffer 120, which in this case is a standard complementary MOS (CMOS) pair consisting of a p-channel FET (PFET) $P_B$ and an NFET $N_B$. The output of signal buffer 120 drives the data signal line $DATA_y$, which indicates the logic state of ROM bit 110 when $READOUT_x$ is HIGH. The use of single NFET $N_R$ in FIG. 2 ensures that the space required by ROM bit 110 is minimal, thereby allowing several thousand ROM bits 110 to occupy a relatively small space on the IC die. Additionally, ROM bit 110 dissipates virtually no power when $READOUT_x$ is in the LOW state, thus maintaining low overall power consumption for the ROM.

Unfortunately, as smaller device geometries are used for the ROM to increase IC functional capacity, the power supply voltage $V_{DD}$ is normally lowered, typically causing voltage margin problems, as depicted in FIG. 3. When $READOUT_x$ becomes active, the voltage level rises from $V_{OFF}$ substantially to $V_{DD}$. Assuming power supply connection 240 (of FIG. 2) is utilized in ROM bit 110, the voltage level on $OUT_y$ becomes $V_{DD}$ less a significant voltage drop across $N_R$, or $V_{ON}$, because the voltage on $READOUT_x$ at the gate of $N_R$ is essentially the same as that at the source, causing $N_R$ to drive a weak logic HIGH level. As seen in FIG. 3, $V_{ON}$ may not be much higher than $V_{TH}$, the threshold voltage at which signal buffer 120 perceives the voltage on $OUT_y$ as a logic HIGH instead of a logic LOW. The difference between $V_{ON}$ and $V_{TH}$ is $V_M$, the resulting voltage margin, which becomes smaller as the power supply voltage $V_{DD}$ is lowered with successive IC design generations implementing smaller device geometries. Thus, variations in the IC manufacturing process, along with variations in the operating temperature and power supply voltage of the IC, may cause $V_{ON}$ to drop below $V_{TH}$, thereby causing improper operation of the ROM.

From the foregoing, a new IC ROM design that minimizes the die area required for each ROM bit and dissipates almost no power when not being read, while allowing for greater voltage margins in the presence of relatively low power supply voltages, is desirable.

SUMMARY OF THE INVENTION

Embodiments of the invention, to be discussed in detail below, provide a ROM architecture that comprises a means for selectively driving one of two complementary logic state signal lines substantially to a voltage reference upon one of a plurality of readout signals becoming active so that a particular ROM bit may be read. The logic state of the ROM bit being read is indicated by which of the complementary logic state signal lines is being driven. A pair of inverting means is then cross-coupled with the two logic state signal lines so that the logic level of each logic state signal line is inverted and driven onto the opposing logic state signal line, resulting in both lines being driven to their proper state, even though only one logic state signal line is being driven directly as a result of the active readout signal. Therefore, only one of the logic state signal lines needs to be monitored to determine the proper state of the particular ROM bit being read.

Other embodiments of the invention take the form of a method of storing digital read-only data as a plurality of addressable bits. First, one of a pair of complementary logic state signal lines is selectively driven substantially to a voltage reference when one of a plurality of readout signals is active. The particular complementary logic state signal line that is being driven indicates the logic state of the ROM bit being addressed by the active readout signal. Each of the complementary logic state signal lines is then inverted and driven onto the opposing logic state signal line so that both lines are driven to their proper state, no matter which is being driven directly as a result of the active readout signal, allowing for other circuitry to read the logic state of the ROM bit from either line.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
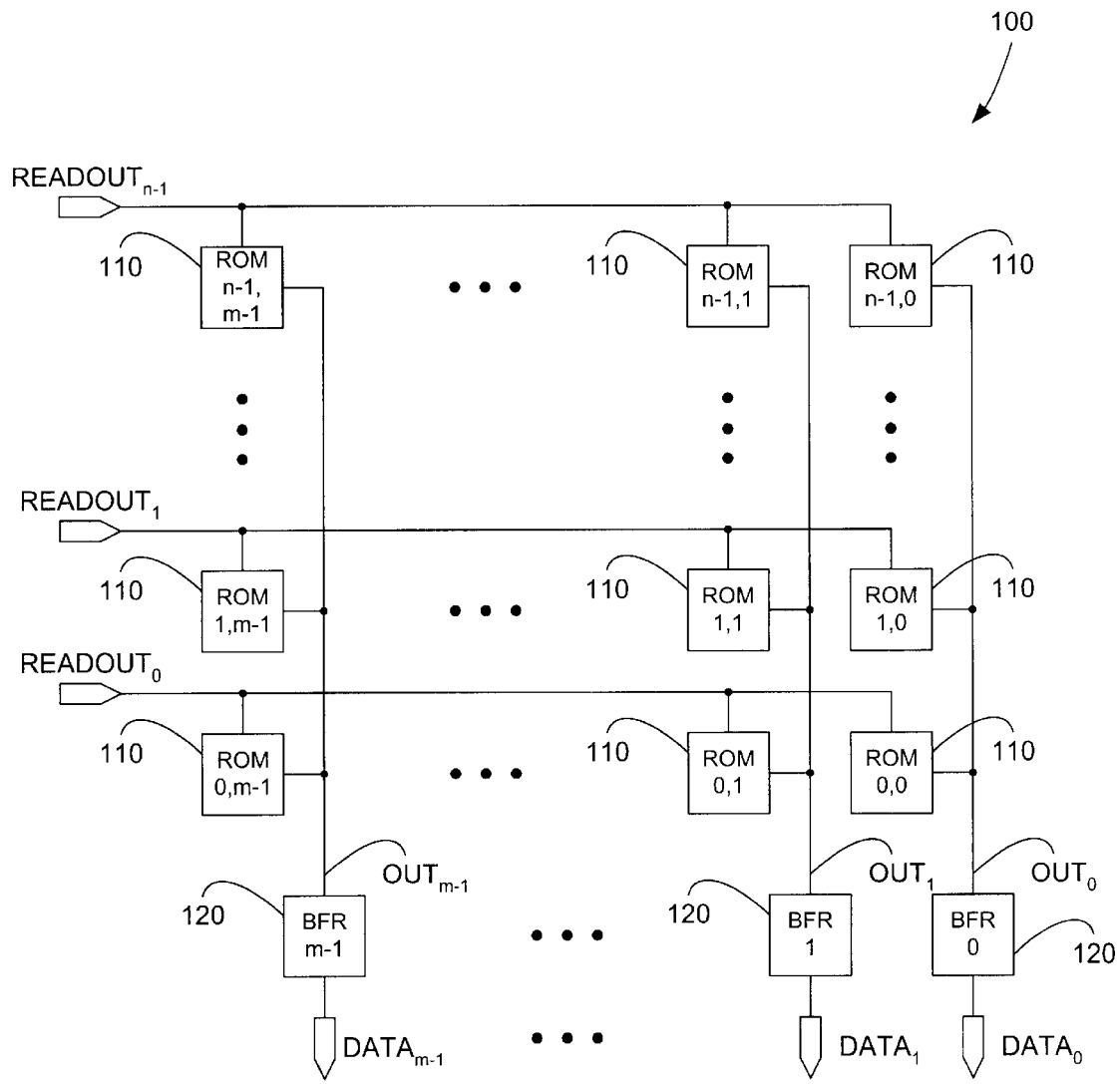
FIG. 1 is a block diagram of a ROM architecture according to the prior art.
Figure 4:
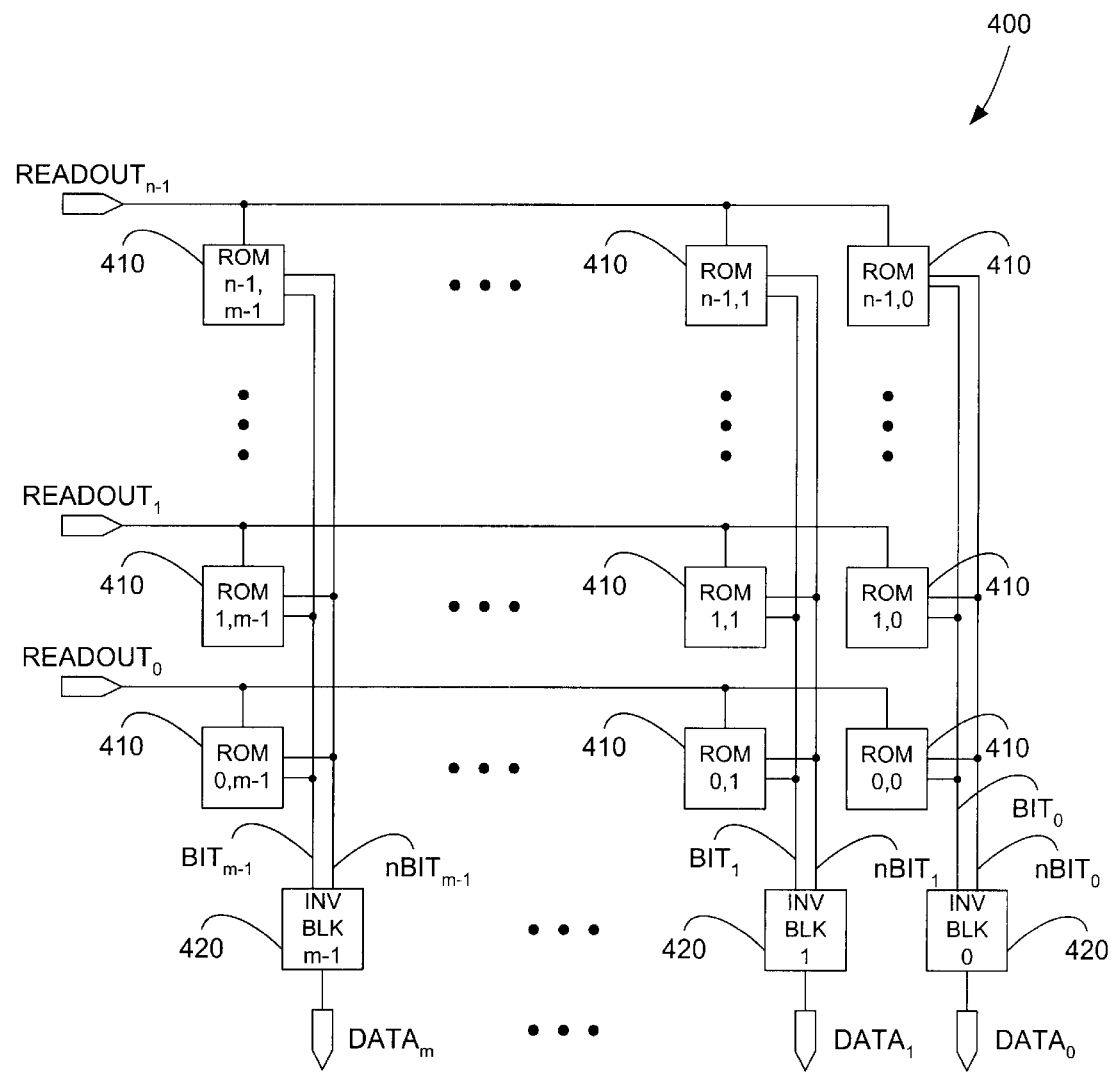
FIG. 4 is a block diagram of a ROM architecture according to an embodiment of the invention.

The overall ROM architecture for an embodiment of the invention is displayed in FIG. 4. Instead of a single output for each ROM bit 110 (from FIG. 1), each new ROM bit 410 has two complementary logic state signal lines, BIT and nBIT. Similar to the prior art, each column of ROM bits 410 corresponds to a particular bit of a data word to be read from the ROM. Each ROM bit 410 within a particular column is individually addressable by a separate readout signal READOUT. As a result, BIT and nBIT of each ROM bit 410 of a particular column are tied together and used as input for an inversion block 420, the output of which is the data information DATA to be read from the ROM.

Figure 5:
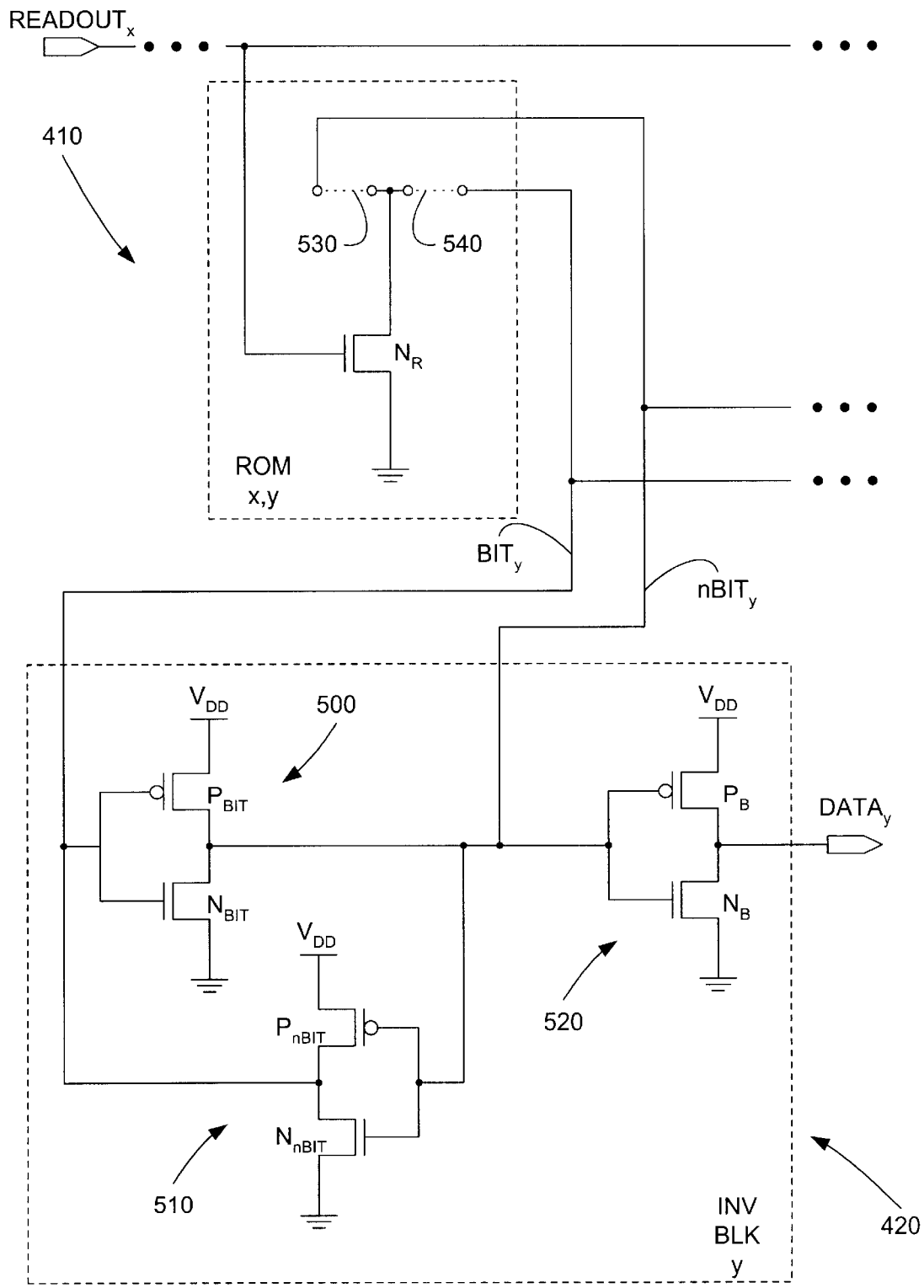
FIG. 5 is a schematic diagram showing greater detail of the ROM bit and inversion block circuits of the ROM architecture of FIG. 3, using a single NFET for the ROM bit.

FIG. 5 shows specific embodiments for ROM bit 410 and inversion block 420 in greater detail. In this case, ROM bit 410 consists of a single NFET $N_R$. $N_R$ represents one logic state when nBIT connection 530 is made, and represents the opposite logic state when BIT connection 540 is made. Either connection 530 or 540 is made; simultaneous presence of both connections 530 and 540 is not employed. Readout signal $READOUT_x$, connected to the gate of $N_R$, addresses ROM bit x,y when at a logic HIGH state, thereby turning ON $N_R$. Therefore, when $READOUT_x$ goes HIGH, either $BIT_y$ or $nBIT_y$ is driven substantially to a ground reference that is attached to the source of $N_R$, depending on the logic state which $N_R$ represents by way of connections 530 and 540. Hence, either $BIT_y$ or $nBIT_y$ will be driven substantially to the ground reference, while the other is not driven to any particular voltage.

$BIT_y$ and $nBIT_y$ from a particular column are used as inputs to an inversion block 420, which comprises two cross-coupled inverters, first inverter 500 and second inverter 510. In the embodiment of FIG. 5, inverters 500 and 510 are standard CMOS inverters using a p-channel and n-channel FET in series, with inverter 500 comprising $P_{BIT}$ and $N_{BIT}$, while inverter 510 utilizes $P_{nBIT}$ and $N_{nBIT}$. Other inverter circuits not discussed herein may also be utilized. Inverters 500 and 510 allow the logic state signal line that is not driven by $N_R$ to assume the proper complementary logic state displayed by the logic state signal line being driven by $N_R$. For example, when nBIT connection 530 is made, $nBIT_y$ is driven substantially to ground, while $BIT_y$ initially remains in an undriven state. However, second inverter 510, by virtue of $nBIT_y$ being in a LOW logic state, forces a HIGH state onto $BIT_y$. First inverter 500 then takes that HIGH signal to drive $nBIT_y$ LOW, which is the same state being driven by $N_R$ onto that signal line. Thus, $BIT_y$ is HIGH and $nBIT_y$ is LOW, representing the logic state of ROM bit x,y. Alternately, if BIT connection 540 is present instead of nBIT connection 530, $BIT_y$ is driven substantially to ground, while $nBIT_y$ is initially floating. First inverter 500 then takes the LOW logic state of $BIT_y$ as input, and forces a HIGH logic state onto $nBIT_y$. Consequently, second inverter 510 takes this HIGH as input, driving a LOW back onto $BIT_y$, which is compatible with the level being forced onto $BIT_y$ by $N_R$. Hence, $BIT_y$ is LOW while $nBIT_y$ is HIGH, reflecting the opposite logic state for ROM bit x,y from that shown in the previous case.

In this embodiment, an additional read buffer is implemented in the form of a third inverter 520. In this particular case, the input for third inverter 520 is $nBIT_y$. However, $BIT_y$ can just as easily be used as input for third inverter 520, depending on the needs of the circuit utilizing the data stored in the ROM. Other types of buffers, such as a noninverting buffer, may also be used in lieu of third inverter 520. Furthermore, third inverter 520, or any other type of buffering, may not be necessary, depending on the particular ROM application. In this instance, either $BIT_y$ or $nBIT_y$ can be used as the $DATA_y$ output.

Figure 2:
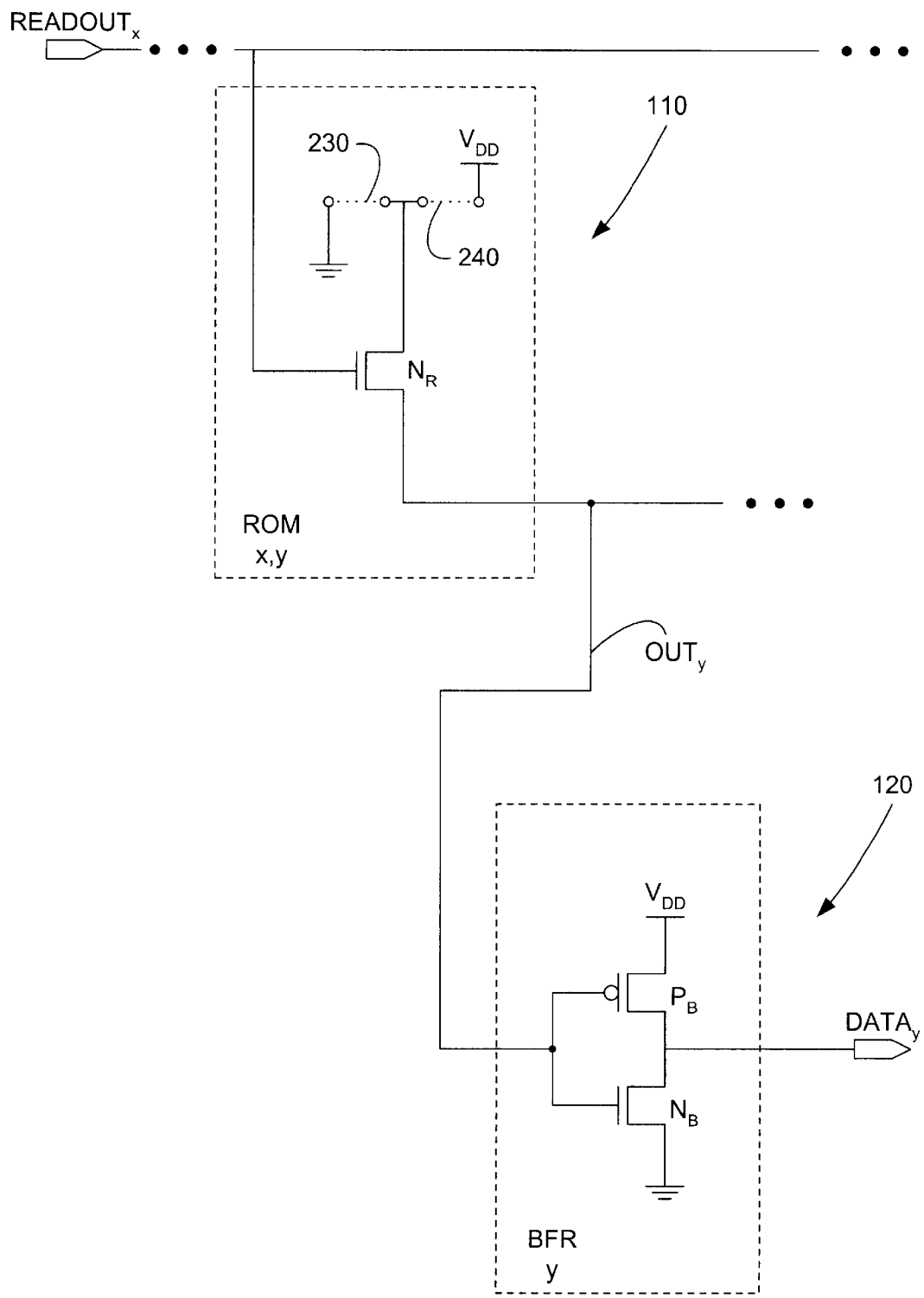
FIG. 2 is a schematic diagram showing greater detail of the ROM bit and signal buffer circuits of the ROM architecture of FIG. 1.
Figure 3:
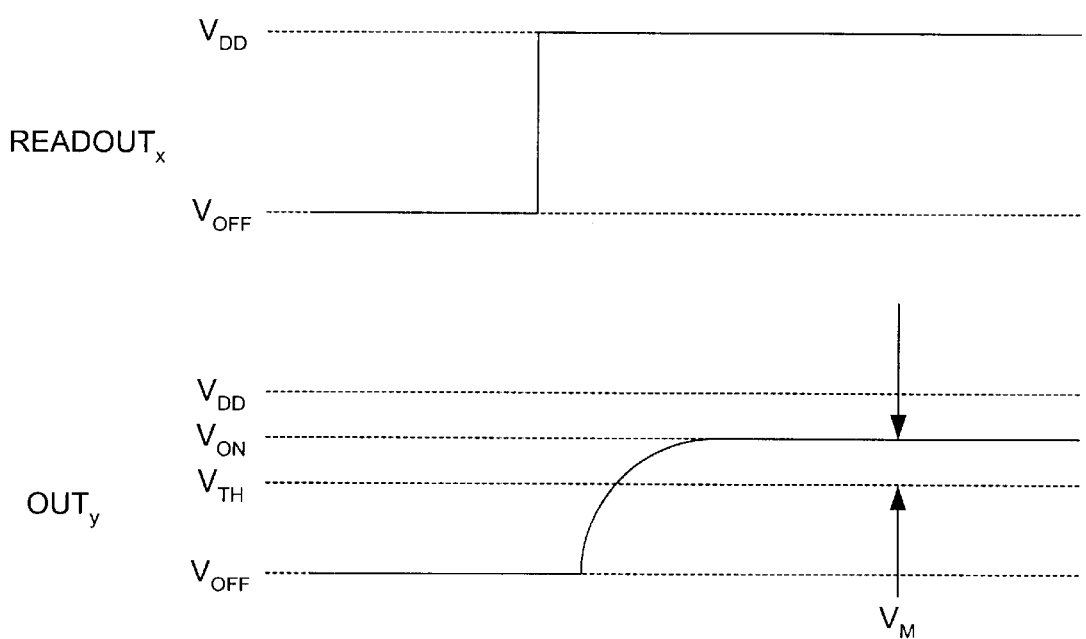
FIG. 3 is a waveform diagram displaying the voltage margin associated with the prior art ROM architecture.

A benefit of this embodiment and others is that NFET $N_R$ will be turned ON completely, thereby preventing voltage margin problems. When $READOUT_x$ is HIGH, the voltage on the drain of $N_R$ will not be higher than the $READOUT_x$ signal voltage on the gate of $N_R$, whether $nBIT_y$ connection 530 or $BIT_y$ connection 540 is present. Thus, regardless of which connection is made, either $BIT_y$ or $nBIT_y$ will be substantially driven to ground, allowing either of first inverter 500 or second inverter 510 to be driven properly with sufficient voltage margin to protect the operation of the circuit against variations in manufacturing processes, operating power supply voltage, and operating temperature. Additionally, the embodiment of FIG. 5 uses a single NFET as in the prior art circuit of FIG. 2, providing a space-efficient solution. The embodiment also does not dissipate significant current when $READOUT_x$ is inactive, since $N_R$ is shut OFF in that case, in similar fashion to the operation of the prior art circuit.

Figure 6:
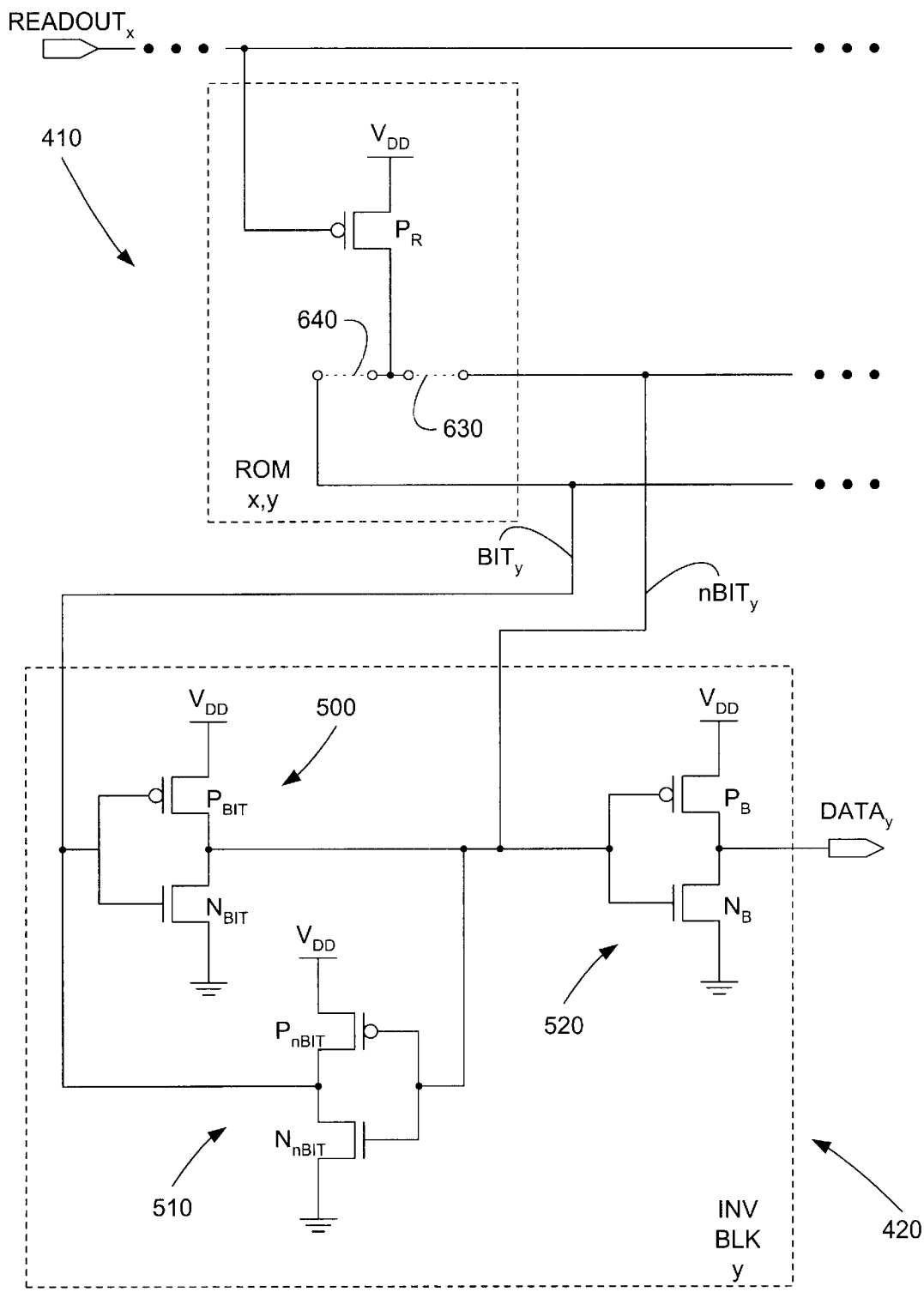
FIG. 6 is a schematic diagram showing greater detail of the ROM bit and inversion block circuits of the ROM architecture of FIG. 3, using a single PFET for the ROM bit.
Figure 7:
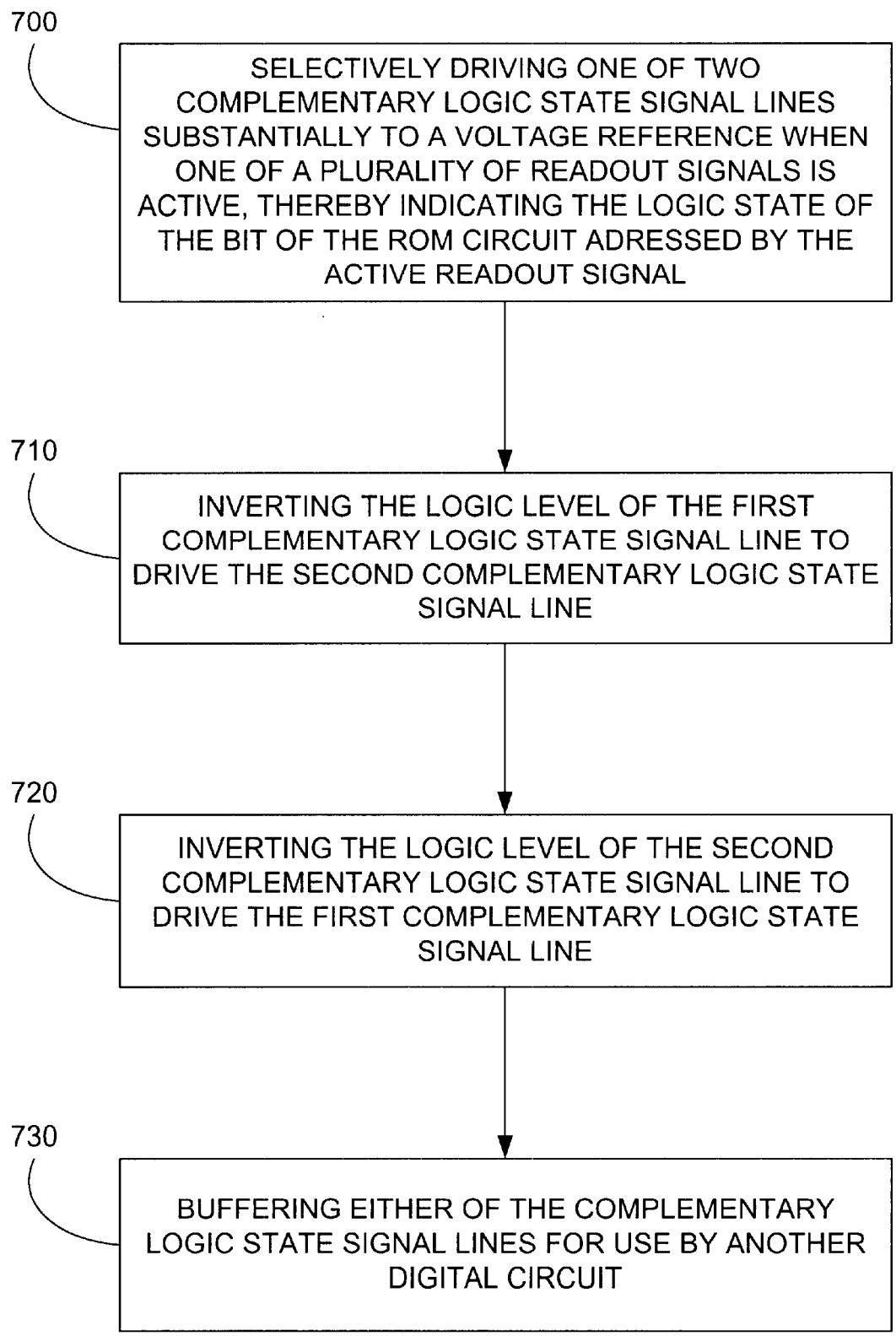
FIG. 7 is a flow chart of a method of storing digital ROM data according to an embodiment of the invention.

Another embodiment of the invention involves a ROM bit based on a PFET $P_R$, as shown in FIG. 6. The source of $P_R$ is connected to $V_{DD}$, and $READOUT_x$ is active when placed in the LOW logic state. When HIGH, $READOUT_x$ effectively shuts OFF $P_R$. When $READOUT_x$ goes LOW, either $BIT_y$ or $nBIT_y$ is forced substantially to $V_{DD}$, depending on whether nBIT connection 630 or BIT connection 640 is present. As a result, either $BIT_y$ or $nBIT_y$ will sustain a voltage close to $V_{DD}$ because the voltage on $READOUT_x$, being close to the ground reference when active, will be lower than either the drain or source voltage of $P_R$, causing $P_R$ to be completely ON. Thus, no voltage margin problem will exist when either $BIT_y$ or $nBIT_y$ drive first inverter 500 or second inverter 510, respectively. In an analogous fashion to the embodiment of FIG. 5, either $BIT_y$ or $nBIT_y$ will be driven HIGH, while the opposing signal line will initially remain undriven. When $BIT_y$ is HIGH as a result of BIT connection 640 being made, first inverter 500 drives $nBIT_y$ LOW, which, in turn, causes second inverter 510 to force $BIT_y$ HIGH, in agreement with the level being driven by $P_R$. Conversely, when $nBIT_y$ is HIGH due to $N_{BIT}$ connection 630 being present, second inverter 510 forces $BIT_y$ LOW, which then causes first inverter 500 to drive $nBIT_y$ HIGH, along with $P_R$. With both $BIT_y$ and $nBIT_y$ being driven to their proper logic states based on nBIT connection 630 and BIT connection 640, either $BIT_y$ or $nBIT_y$ can be used as the output signal for ROM bit x,y. Also, third inverter 520, or a noninverting buffer, may be used to buffer either $BIT_y$ or $nBIT_y$ from other circuitry accessing the ROM data. Alternately, third inverter 520 may be eliminated if the buffering it provides is not required in a particular application.

In most IC process technologies, p-channel FETs require more surface area to implement than n-channel FETs. Thus, for many applications, embodiments utilizing n-channel FETs for ROM bit 110 will be more desirable.

Another embodiment of the present invention takes the form of a method of storing digital. read-only data. First, one of two complementary logic state signal lines is selectively driven substantially to a voltage reference upon one of a plurality of readout signals being active (step 700). Thus, the state of the ROM bit addressed by the active readout signal is exemplified by which of the two complementary logic state signal lines is being driven. Next, the logic state of each of the complementary logic state signal lines is inverted to drive the other complementary signal line to the opposite logic state (steps 710 and 720). As a result, both complementary logic state signal lines are driven to the proper logic state, regardless of which is actually being selectively driven as a result of the active readout signal. Either complementary logic state signal line could then be buffered, if necessary, for use by other circuitry (step 730). However, depending on the particular application, such buffering may not be necessary or desirable.

From the foregoing, the embodiments of the invention have been shown to provide a ROM circuit and method that are particularly useful in low power supply voltage environments. Other specific circuits and methods embodying the invention are also possible. Therefore, the present invention is not to be limited to the specific forms so described and illustrated; the invention is limited only by the claims.

What is claimed is:

1. A digital read-only memory circuit capable of storing a plurality of addressable bits, comprising:

means for selectively driving exactly one of a first and second complementary logic state signal lines substantially to a voltage reference when one of a plurality of readout signals is active, the first complementary logic state signal line indicating a first logic state, the second complementary logic state signal line indicating a second logic state, the complementary logic state signal line that is being driven indicating the logic state of the bit of the read-only memory circuit addressed by the active readout signal;

first means for inverting the logic level on the first complementary logic state signal line to drive the second complementary logic state signal line; and second means for inverting the logic level on the second complementary logic state signal line to drive the first complementary logic state signal line.

2. The digital read-only memory circuit of claim 1, wherein the selectively driving means is a plurality of n-channel FETs, with each n-channel FET representing a bit, the gate of each n-channel FET being coupled with one of the plurality of readout signals, the source of each n-channel FET being connected to a ground reference, the drain of each n-channel FET being connected to exactly one of the complementary logic state signal lines.

3. The digital read-only memory circuit of claim 1, wherein the selectively driving means is a plurality of p-channel FETs, with each p-channel FET representing a bit, the gate of each p-channel FET being coupled with one of the plurality of readout signals, the source of each p-channel FET being connected to a supply voltage reference, the drain of each p-channel FET being connected to exactly one of the complementary logic state signal lines.

4. The digital read-only memory circuit of claim 1, wherein the first inverting means comprises an n-channel FET and a p-channel FET connected in series as a complementary MOS pair.

5. The digital read-only memory circuit of claim 1, wherein the second inverting means comprises an n-channel FET and a p-channel FET connected in series as a complementary MOS pair.

6. The digital read-only memory circuit of claim 1, further comprising means for buffering the logic level on the first complementary logic state signal line for use by another digital circuit.

7. The digital read-only memory circuit of claim 6, wherein the buffering means comprises an n-channel FET and a p-channel FET connected in series as a complementary MOS pair.

8. The digital read-only memory circuit of claim 1, further comprising means for buffering the logic level on the second complementary logic state signal line for use by another digital circuit.

9. The digital read-only memory circuit of claim 8, wherein the buffering means comprises an n-channel FET and a p-channel FET connected in series as a complementary MOS pair.

10. A digital read-only memory circuit capable of storing a plurality of addressable bits, comprising:

a plurality of n-channel FETs, with each n-channel FET representing a bit, the gate of each n-channel FET being coupled with one of a plurality of readout signals, the source of each n-channel FET being connected to a ground reference, the drain of each n-channel FET being connected to exactly one of a first and second complementary logic state signal lines, the first complementary logic state signal line indicating a first logic state, the second complementary logic state signal line indicating a second logic state;

a first inverter, the input of the first inverter being coupled with the first complementary logic state signal line; and a second inverter, the input of the second inverter being coupled with the second complementary logic state signal line, the input of the second inverter also being coupled with the output of the first inverter, the output of the second inverter being coupled with the input of the first inverter.

11. The digital read-only memory circuit of claim 10, wherein the first inverter comprises an n-channel FET and a p-channel FET connected in series as a complementary MOS pair.

12. The digital read-only memory circuit of claim 10, wherein the second inverter comprises an n-channel FET and a p-channel FET connected in series as a complementary MOS pair.

13. The digital read-only memory circuit of claim 10, further comprising a read buffer, the input of the read buffer being driven by the output of the first inverter.

14. The digital read-only memory circuit of claim 13, wherein the read buffer comprises an n-channel FET and a p-channel FET connected in series as a complementary MOS pair.

15. The digital read-only memory circuit of claim 10, further comprising a read buffer, the input of the read buffer being driven by the output of the second inverter.

16. The digital read-only memory circuit of claim 15, wherein the read buffer comprises an n-channel FET and a p-channel FET connected in series as a complementary MOS pair.

17. A digital read-only memory circuit capable storing a plurality of addressable bits, comprising:

a plurality of p-channel FETs, with each p-channel FET representing a bit, the gate of each p-channel FET being coupled with one of a plurality of readout signals, the source of each p-channel FET being connected to a supply voltage reference, the drain of each p-channel FET being connected to exactly one of a first and second complementary logic state signal lines, the first complementary logic state signal line indicating a first logic state, the second complementary logic state signal line indicating a second logic state;

a first inverter, the input of the first inverter being coupled with the first complementary logic state signal line; and a second inverter, the input of the second inverter being coupled with the second complementary logic state signal line, the input of the second inverter also being coupled with the output of the first inverter, the output of the second inverter being coupled with the input of the first inverter.

18. The digital read-only memory circuit of claim 17, wherein the first inverter comprises an n-channel FET and a p-channel FET connected in series as a complementary MOS pair.

19. The digital read-only memory circuit of claim 17, wherein the second inverter comprises an n-channel FET and a p-channel FET connected in series as a complementary MOS pair.

20. The digital read-only memory circuit of claim 17, further comprising a read buffer, the input of the read buffer being driven by the output of the first inverter.

21. The digital read-only memory circuit of claim 20, wherein the read buffer comprises an n-channel FET and a p-channel FET connected in series as a complementary MOS pair.

22. The digital read-only memory circuit of claim 17, further comprising a read buffer, the input of the read buffer being driven by the output of the second inverter.

23. The digital read-only memory circuit of claim 22, wherein the read buffer comprises an n-channel FET and a p-channel FET connected in series as a complementary MOS pair.

24. A method of storing digital read-only data as a plurality of addressable bits, the method comprising the steps of:

selectively driving exactly one of a first and second complementary logic state signal lines substantially to a voltage reference when one of a plurality of readout signals is active, the first complementary logic state signal line indicating a first logic state, the second complementary logic state signal line indicating a second logic state, the complementary logic state signal line that is being driven indicating the logic state of the bit of the read-only memory circuit addressed by the active readout signal;

inverting the logic level on the first complementary logic state signal line to drive the second complementary logic state signal line; and inverting the logic level on the second complementary logic state signal line to drive the first complementary logic state signal line.

25. The method of claim 24, further comprising the step of buffering the logic level on the first complementary logic state signal line for use by another digital circuit.

26. The method of claim 24, further comprising the step of buffering the logic level on the second complementary logic state signal line for use by another digital circuit.

* * * * *